(12) United States Patent
Osawa et al.

(10) Patent No.: US 11,765,978 B2
(45) Date of Patent: Sep. 19, 2023

(54) ACOUSTIC WAVE DEVICE (71) Applicant: Murata Manufacturing Co., Ltd., Nagaokakyo (JP)

(72) Inventors: Takashi Osawa, Nagaokakyo (JP); Masahiro Fukushima, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 425 days.

(21) Appl. No.: 16/912,737

(22) Filed: Jun. 26, 2020

(65) Prior Publication Data
US 2021/0036209 A1 Feb. 4, 2021

(30) Foreign Application Priority Data

Jul. 31, 2019 (JP) .................. 2019-140976

(51) Int. Cl.
*H10N 30/88* (2023.01)
*H10N 30/85* (2023.01)
*H10N 30/87* (2023.01)

(52) U.S. Cl.
CPC ............. *H10N 30/88* (2023.02); *H10N 30/85* (2023.02); *H10N 30/87* (2023.02)

(58) Field of Classification Search
None
See application file for complete search history.

(56) References Cited

U.S. PATENT DOCUMENTS

2003/0025422 A1* 2/2003 Watanabe .......... H03H 9/02992
310/348

FOREIGN PATENT DOCUMENTS

JP 2002-261582 A 9/2002
WO WO-2011024894 A1 * 3/2011 ......... F02M 51/0603

* cited by examiner

*Primary Examiner* — Erica S Lin
(74) *Attorney, Agent, or Firm* — KEATING & BENNETT, LLP (57) ABSTRACT

An acoustic wave device includes a piezoelectric substrate that includes first and second main surfaces, an IDT electrode on the first main surface, a support having a rectangular or substantially rectangular frame shape and including a cavity, first and second sides, and a first corner portion connected to the first and second sides, and the support being provided on the first main surface such that the cavity surrounds the IDT electrode, and a cover on the support and covering the cavity. A straight or substantially straight grinding trace is provided on the second main surface. The grinding trace leads to the first corner portion as viewed in plan. One of an angle between the first side and the grinding trace and an angle between the second side and the grinding trace as viewed in plan is about 9.5° or less.

10 Claims, 5 Drawing Sheets

ACOUSTIC WAVE DEVICE

CROSS REFERENCE TO RELATED APPLICATIONS

This application claims the benefit of priority to Japanese Patent Application No. 2019-140976 filed on Jul. 31, 2019. The entire contents of this application are hereby incorporated herein by reference.

BACKGROUND OF THE INVENTION

1. Field of the Invention

The present invention relates to an acoustic wave device.

2. Description of the Related Art

Acoustic wave devices have been widely used for filters or the like of cellular phones. Japanese Unexamined Patent Application Publication No. 2002-261582 discloses an example of the acoustic wave devices. The acoustic wave device has a wafer level package (WLP) structure, and includes a comb electrode and side walls that surround the comb electrode, which are provided on a main surface of a piezoelectric substrate. An insulating sheet is provided so as to seal a cavity of the side walls. Japanese Unexamined Patent Application Publication No. 2002-261582 describes fabricating a plurality of surface acoustic wave (SAW) elements by using a thick wafer-shaped piezoelectric substrate, collectively mounting the SAW elements on a carrier, and grinding the piezoelectric substrate to be thinned.

In grinding the piezoelectric substrate, however, a stress is applied between the side walls and the piezoelectric substrate. At this time, a particularly large stress is applied at the corner portions of the side walls. Therefore, the side walls may be separated from the piezoelectric substrate with such separation starting at the corner portions.

SUMMARY OF THE INVENTION

Preferred embodiments of the present invention provide acoustic wave devices in each of which separation of a support from a piezoelectric substrate is able to be reduced or prevented.

According to a preferred embodiment of the present invention, an acoustic wave device includes a piezoelectric substrate that includes a first main surface and a second main surface that oppose each other; an interdigital transducer (IDT) electrode provided on the first main surface of the piezoelectric substrate; a support having a rectangular or substantially rectangular frame shape, the support including a cavity, a first side and a second side that define a portion of an outer peripheral edge of the support, and a corner portion connected to the first side and the second side, and the support being provided on the first main surface of the piezoelectric substrate such that the cavity surrounds the IDT electrode; and a cover provided on the support so as to cover the cavity of the support, in which a straight or substantially straight grinding trace is provided on the second main surface of the piezoelectric substrate, the grinding trace leading to the corner portion of the support as viewed in plan, and one of an angle between the first side of the support and the grinding trace and an angle between the second side and the grinding trace as viewed in plan is about 9.5° or less.

With the acoustic wave devices according to preferred embodiments of the present invention, separation of a support from a piezoelectric substrate is able to be reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified below by describing preferred embodiments of the present invention with reference to the drawings.

The preferred embodiments described herein are illustrative, and components from different preferred embodiments may be partially replaced or combined with each other.

Figure 1:
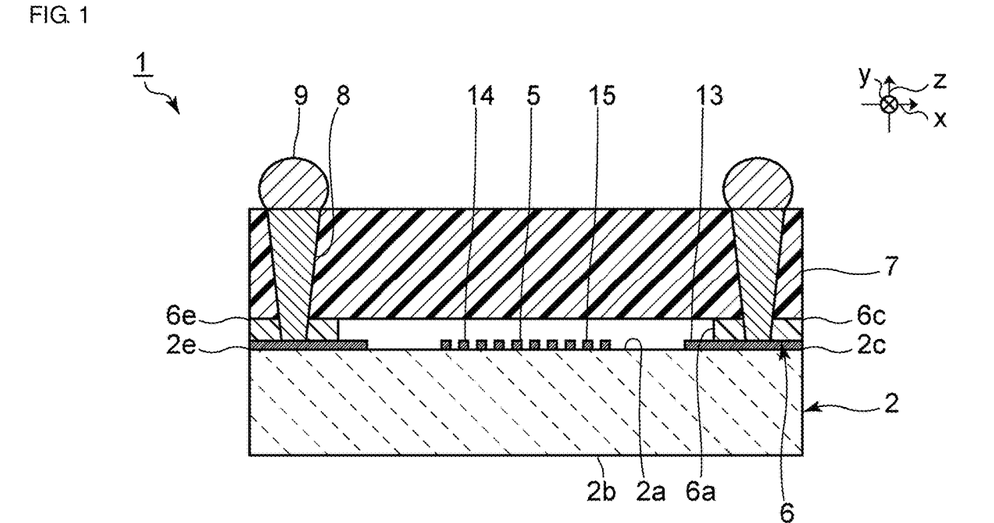
FIG. 1 is an elevational sectional view of an acoustic wave device according to a first preferred embodiment of the present invention.

FIG. 1 is an elevational sectional view of an acoustic wave device according to a first preferred embodiment of the present invention.

An acoustic wave device 1 includes a piezoelectric substrate 2. The piezoelectric substrate 2 includes a first main surface 2a and a second main surface 2b that oppose each other. The piezoelectric substrate 2 has a rectangular or substantially rectangular shape as viewed in plan. Herein, the term "as viewed in plan" refers to a state of being seen from the upper side in FIG. 1, and the term "as viewed from the bottom side" refers to a state of being seen from the lower side in FIG. 1. The shape of the piezoelectric substrate 2 is not limited to the shape defined above.

The piezoelectric substrate 2 according to the present preferred embodiment is a piezoelectric substrate including only a piezoelectric layer. Examples of the material of the piezoelectric layer include lithium tantalate, lithium niobate, zinc oxide, aluminum nitride, crystal, and lead zirconate titanate (PZT). As illustrated in FIG. 1, an interdigital transducer (IDT) electrode 5 is provided on the first main surface 2a of the piezoelectric substrate 2.

Figure 2:
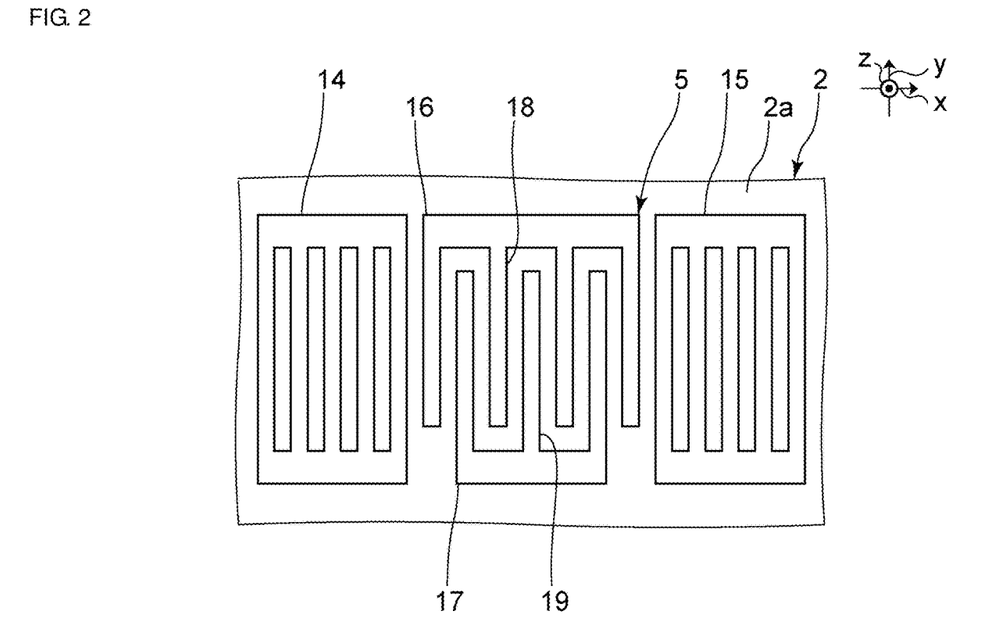
FIG. 2 is a plan view illustrating an electrode structure of an IDT electrode according to the first preferred embodiment of the present invention.

FIG. 2 is a plan view illustrating an electrode structure of the IDT electrode according to the first preferred embodiment. In FIG. 2, wiring electrodes or the like connected to the IDT electrode 5 are not illustrated.

The IDT electrode 5 includes a first busbar 16 and a second busbar 17 that oppose each other, and a plurality of first electrode fingers 18 and a plurality of second electrode fingers 19. Respective first ends of the plurality of first electrode fingers 18 are connected to the first busbar 16. Respective first ends of the plurality of second electrode fingers 19 are connected to the second busbar 17. The plurality of first electrode fingers 18 and the plurality of second electrode fingers 19 are interdigitated.

An acoustic wave is excited by applying an AC voltage to the IDT electrode 5. A pair of reflectors 14 and 15 are provided on the piezoelectric substrate 2 on respective sides of the IDT electrode 5 in the propagation direction of the acoustic wave. The IDT electrode 5, the reflector 14, and the reflector 15 may be defined by a laminated metal film including a plurality of metal layers that are laminated, or may be defined by a single-layer metal film. Herein, the propagation direction of the acoustic wave is referred to as an "x direction", and a direction that is orthogonal or substantially orthogonal to the x direction is referred to as a "y direction". An x-y plane is parallel or substantially parallel to the first main surface 2a of the piezoelectric substrate 2. A direction that is orthogonal or substantially orthogonal to the x direction and the y direction is referred to as a "z direction".

The acoustic wave device 1 according to the present preferred embodiment is an acoustic wave resonator. More specifically, the acoustic wave device 1 is preferably a surface acoustic wave (SAW) element, for example. The acoustic wave device according to the present preferred embodiment may alternatively be a longitudinally coupled resonator acoustic wave filter, a ladder filter that has a plurality of acoustic wave resonators, a multiplexer, or the like, for example.

Returning to FIG. 1, a support member 6 is provided on the first main surface 2a of the piezoelectric substrate 2. The support member 6 has a rectangular or substantially rectangular frame shape, and includes a cavity 6a. The cavity 6a surrounds the IDT electrode 5. In the present preferred embodiment, the support member 6 is made of an appropriate resin. A cover member 7 is provided on the support member 6 and covers the cavity 6a.

An electrode pad 13 electrically connected to the IDT electrode 5 is provided on the first main surface 2a of the piezoelectric substrate 2. The support member 6 covers at least a portion of the electrode pad 13. Under-bump metal layers 8 penetrate the support member 6 and the cover member 7. Respective first ends of the under-bump metal layers 8 are connected to the electrode pad 13. Bumps 9 are joined to respective second ends of the under-bump metal layers 8. The bumps 9 may be made of solder, for example.

The IDT electrode 5 is disposed in a hollow space surrounded by the piezoelectric substrate 2, the support member 6, and the cover member 7. The IDT electrode 5 is electrically connected to the outside via the electrode pad 13, the under-bump metal layers 8, and the bumps 9. Thus, the acoustic wave device 1 has a wafer level package (WLP) structure.

The piezoelectric substrate 2 and the support member 6 according to the present preferred embodiment will be described in detail below.

Figure 3:
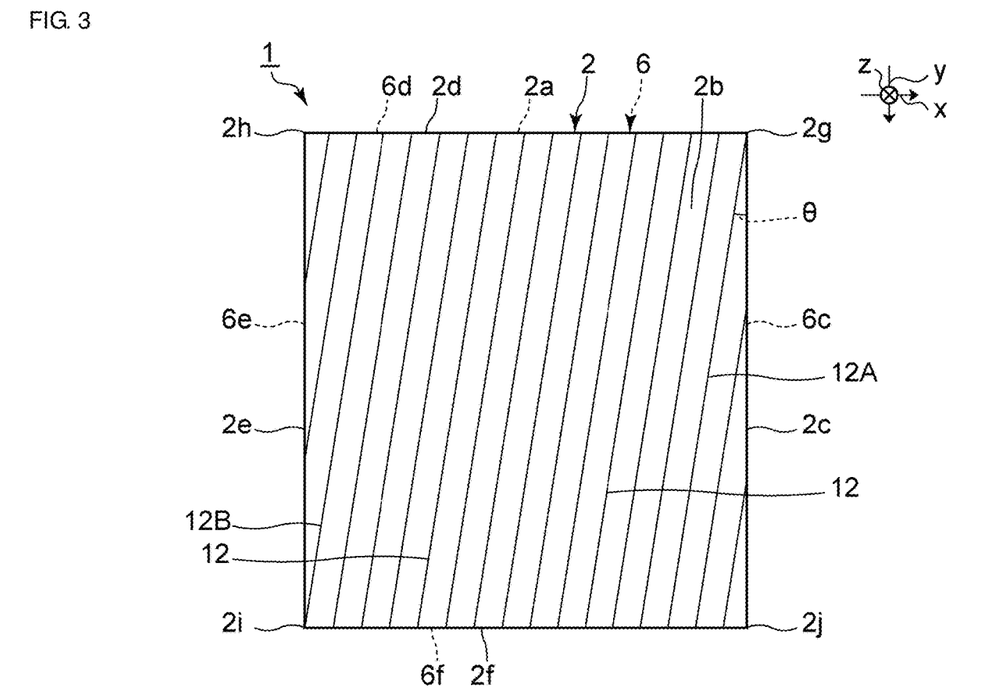
FIG. 3 is a schematic bottom view of the acoustic wave device according to the first preferred embodiment of the present invention.

FIG. 3 is a schematic bottom view of the acoustic wave device according to the first preferred embodiment.

The piezoelectric substrate 2 includes a first side 2c, a second side 2d, a third side 2e, and a fourth side 2f. The first side 2c is connected to the second side 2d and the fourth side 2f. The first side 2c and the third side 2e oppose each other. The second side 2d and the fourth side 2f oppose each other. The first side 2c, the second side 2d, the third side 2e, and the fourth side 2f define a portion of the outer peripheral edge of the piezoelectric substrate 2. The term "outer peripheral edge" as used herein refers to the outer peripheral edge as viewed in plan or as viewed from the bottom side.

The piezoelectric substrate 2 includes a first corner portion 2g, a second corner portion 2h, a third corner portion 2i, and a fourth corner portion 2j. The first side 2c and the second side 2d are connected to each other at the first corner portion 2g. The second side 2d and the third side 2e are connected to each other at the second corner portion 2h. The third side 2e and the fourth side 2f are connected to each other at the third corner portion 2i. The fourth side 2f and the first side 2c are connected to each other at the fourth corner portion 2j. The first side 2c and the third side 2e are long sides, and the second side 2d and the fourth side 2f are the short sides shorter than the first side 2c and the third side 2e.

A plurality of straight or substantially straight grinding traces 12 are provided on the second main surface 2b of the piezoelectric substrate 2. The plurality of grinding traces 12 extend in parallel or substantially in parallel with each other. The plurality of grinding traces 12 are provided in a process of grinding the piezoelectric substrate 2, for example, during the manufacture of the acoustic wave device 1. One grinding trace 12A, among the plurality of grinding traces 12, leads to the first corner portion 2g. As schematically illustrated in FIG. 3, a large number of grinding traces 12 are formed by grinding, and therefore one grinding trace 12A, among the plurality of grinding traces 12, leads to the first corner portion 2g.

Figure 4:
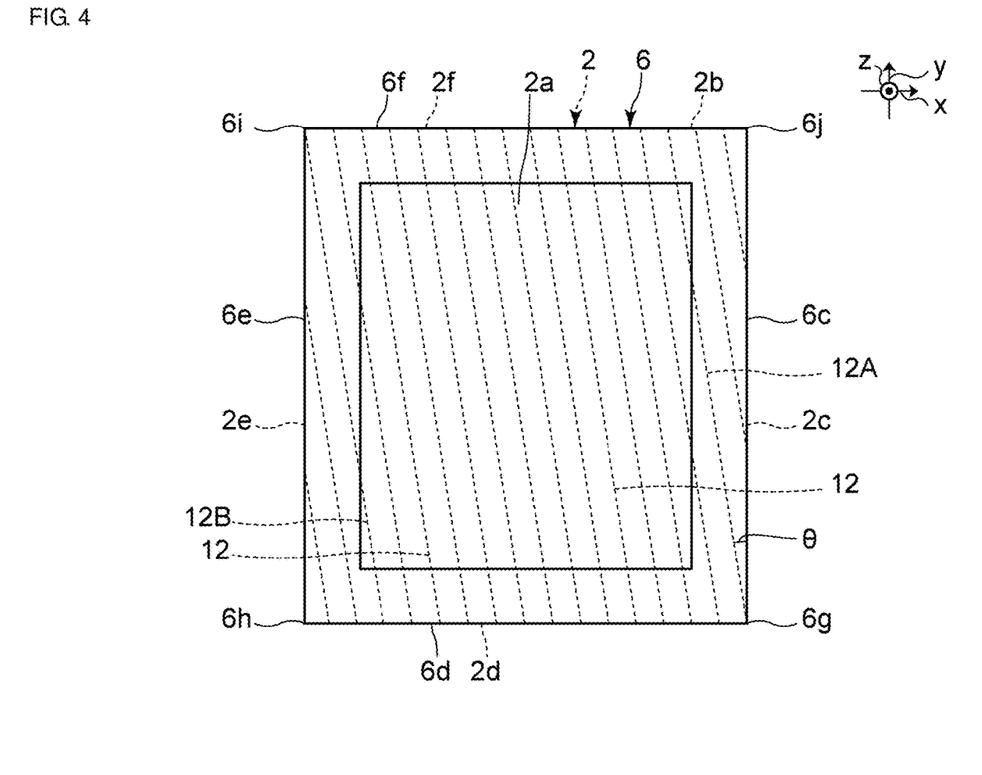
FIG. 4 is a schematic plan view of a piezoelectric substrate and a support member according to the first preferred embodiment of the present invention.

FIG. 4 is a schematic plan view of the piezoelectric substrate and the support member according to the first preferred embodiment. In FIG. 4, the under-bump metal layers 8 and the electrode structure on the piezoelectric substrate 2 are not illustrated.

The support member 6 includes a first side 6c, a second side 6d, a third side 6e, and a fourth side 6f. The first side 6c and the third side 6e oppose each other. The second side 6d and the fourth side 6f oppose each other. The first side 6c, the second side 6d, the third side 6e, and the fourth side 6f define a portion of the outer peripheral edge of the support member 6.

The support portion 6 includes a first corner portion 6g, a second corner portion 6h, a third corner portion 6i, and a fourth corner portion 6j. The first side 6c and the second side 6d are connected to each other at the first corner portion 6g. The second side 6d and the third side 6e are connected to each other at the second corner portion 6h. The third side 6e and the fourth side 6f are connected to each other at the third corner portion 6i. The fourth side 6f and the first side 6c are connected to each other at the fourth corner portion 6j. The first side 6c and the third side 6e are the long sides, and the second side 6d and the fourth side 6f are the short sides that are shorter than the first side 6c and the third side 6e.

The relationship between the support member 6 and the piezoelectric substrate 2 of the acoustic wave device 1 as viewed in plan will be described below. The first side 6c of the support member 6 and the first side 2c of the piezoelectric substrate 2 overlap each other. Similarly, the second side 6d, the third side 6e, and the fourth side 6f of the support member 6 and the second side 2d, the third side 2e, and the fourth side 2f of the piezoelectric substrate 2 overlap each other, respectively. The first corner portion 6g of the support member 6 and the first corner portion 2g of the piezoelectric substrate 2 overlap each other. Similarly, the second corner portion 6h, the third corner portion 6i, and the fourth corner portion 6j of the support member 6 and the second corner portion 2h, the third corner portion 2i, and the fourth corner portion 2j of the piezoelectric substrate 2 overlap each other, respectively. Each side of the support member 6 and each side of the piezoelectric substrate 2 may not overlap each other as viewed in plan, and each corner portion of the support member 6 and each corner portion of the piezoelectric substrate 2 may not overlap each other as viewed in plan.

The grinding trace 12A which leads to the first corner portion 2g of the piezoelectric substrate 2 leads to the first corner portion 6g of the support member 6 as viewed in plan. The angle between the first side 2c of the piezoelectric substrate 2 and the grinding trace 12A is preferably about 9.5° or less, for example. Thus, an angle θ between the first side 6c of the support member 6 and the grinding trace 12A as viewed in plan is also preferably about 9.5° or less, for example. It is only necessary that at least one of the angle between the first side 6c and the grinding trace 12A and the angle between the second side 6d and the grinding trace 12A should preferably be about 9.5° or less, for example. It is only necessary that the grinding trace 12A should be straight or substantially straight. The term "substantially straight" as used herein refers to a state in which the direction in which the grinding trace 12A extends is not varied to such a degree that the angle formed between the first side 6c or the second side 6d and the grinding trace 12A is measurable.

In the present preferred embodiment, the grinding trace 12A which is straight or substantially straight is provided on the second main surface 2b of the piezoelectric substrate 2, the grinding trace 12A leads to the first corner portion 6g of the support member 6 as viewed in plan, and the angle θ between the first side 6c and the grinding trace 12A is preferably about 9.5° or less, for example. This reduces or prevents separation of the support member 6 from the piezoelectric substrate 2. Such features will be described below together with an example of a method of manufacturing the acoustic wave device 1 according to the present preferred embodiment. It should be noted, however, that the method of manufacturing the acoustic wave device 1 is not limited to the method described below.

FIGS. 5A to 5D are each an elevational sectional view illustrating an example of a method of manufacturing the acoustic wave device according to the first preferred embodiment. FIGS. 6A to 6D are each an elevational sectional view illustrating an example of a method of manufacturing the acoustic wave device according to the first preferred embodiment.

Figure 5A:
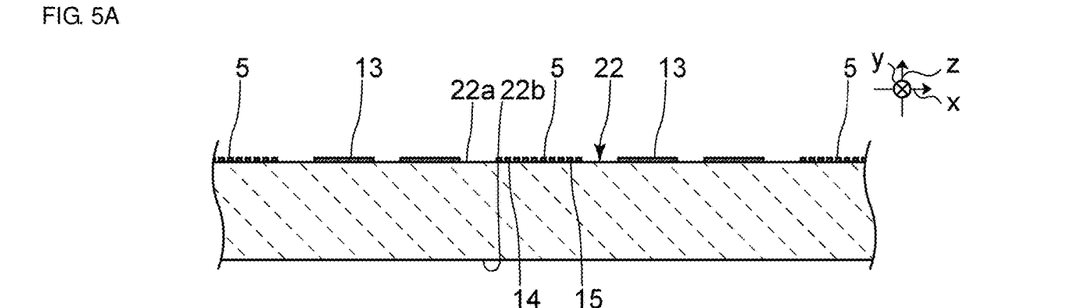
FIGS. 5A to 5D are each an elevational sectional view illustrating an example of a method of manufacturing the acoustic wave device according to the first preferred embodiment of the present invention.

As illustrated in FIG. 5A, a wafer-shaped piezoelectric substrate 22 is prepared. The piezoelectric substrate 22 includes a first main surface 22a and a second main surface 22b that oppose each other. The piezoelectric substrate 2 according to the present preferred embodiment illustrated in FIG. 1 is obtained by dividing the piezoelectric substrate 22 into individual pieces. Next, a plurality of IDT electrodes 5, reflectors 14, reflectors 15, and electrode pads 13 are formed on the first main surface 22a of the piezoelectric substrate 22. The plurality of IDT electrodes 5, reflectors 14, reflectors 15, and electrode pads 13 may be formed by a sputtering method, a vacuum deposition method, or the like, for example.

Figure 5B:
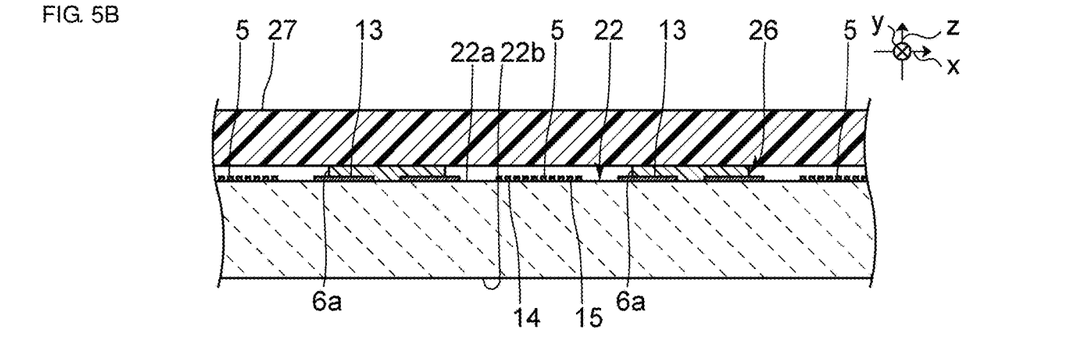

Next, as illustrated in FIG. 5B, a support member 26 is provided on the first main surface 22a of the piezoelectric substrate 22. The support member 26 includes a plurality of cavities 6a. The support member 26 is provided such that each of the cavities 6a surrounds the IDT electrode 5, the reflector 14, and the reflector 15 and so as to cover at least a portion of the electrode pads 13. The support member 26 may be formed by a photolithographic method, for example.

Figure 5C:
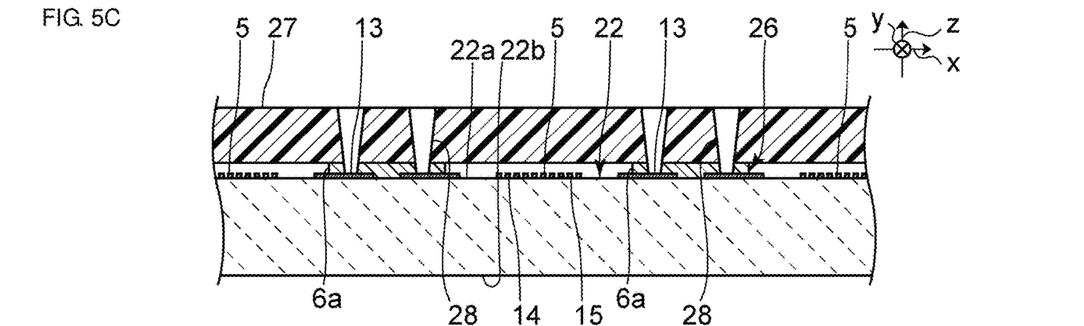

Next, a cover member 27 is provided on the support member 26 so as to seal the plurality of cavities 6a of the support member 26. Next, as illustrated in FIG. 5C, a plurality of through holes 28 that penetrate the cover member 27 and the support member 26 are formed. The through holes 28 are formed to lead to the electrode pads 13. The through holes 28 may be formed by irradiation with laser light, for example.

Figure 5D:
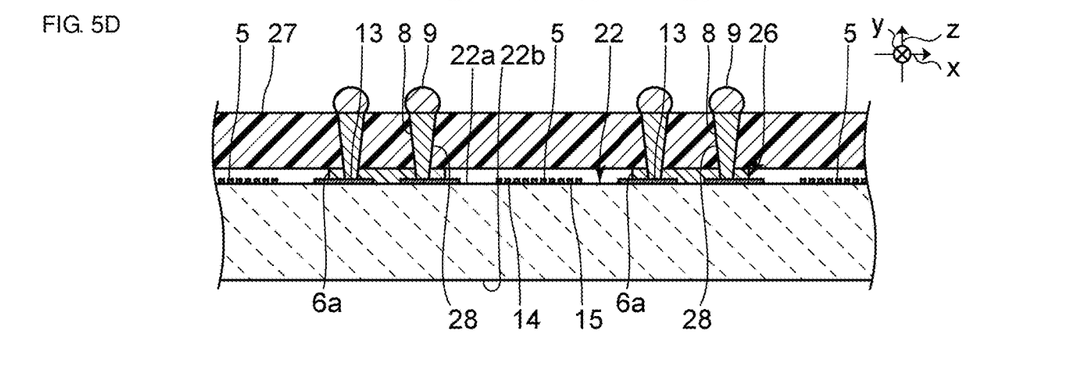

Next, as illustrated in FIG. 5D, under-bump metal layers 8 are formed in the through holes 28 so as to be connected to the electrode pads 13. The under-bump metal layers 8 may be formed by a plating method or the like, for example. Next, bumps 9 are provided so as to be joined to the under-bump metal layers 8.

Figure 6A:
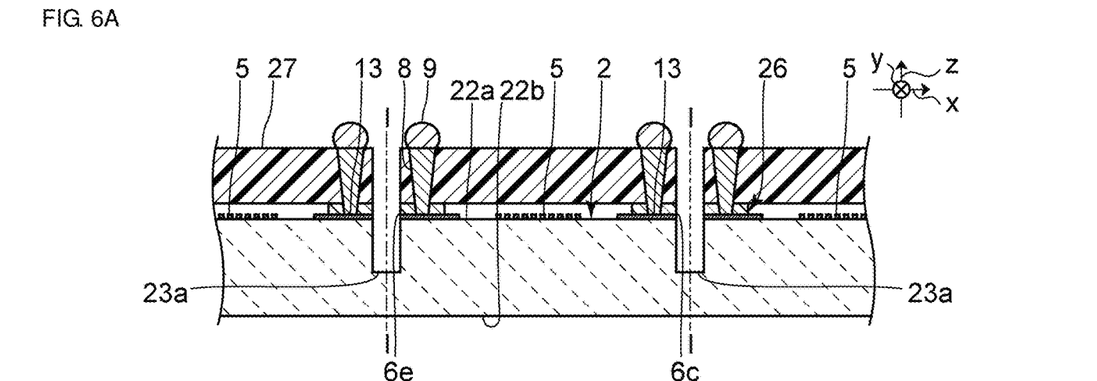
FIGS. 6A to 6D are each an elevational sectional view illustrating an example of a method of manufacturing the acoustic wave device according to the first preferred embodiment of the present invention.

Next, as illustrated in FIG. 6A, the materials are cut with a dicing machine from the side of the cover member 27 along dicing lines I-I. Consequently, the cover member 27 and the support member 26 are cut. At the same time, the piezoelectric substrate 22 is cut halfway to provide a plurality of first groove portions 23a.

Figure 6B:
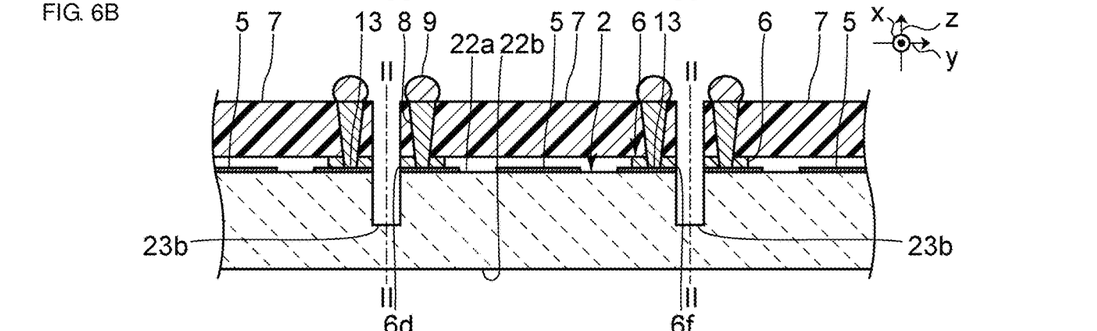

Next, the materials are cut with a dicing machine from the side of the cover member 27 along dicing lines II-II illustrated in FIG. 6B, which extend in a direction that is orthogonal or substantially orthogonal to the dicing lines I-I. Consequently, the cover member 27 and the support member 26 are divided into individual pieces to obtain a plurality of cover members 7 and a plurality of support members 6. At the same time, the piezoelectric substrate 22 is cut halfway to provide a plurality of second groove portions 23b.

Figure 6C:
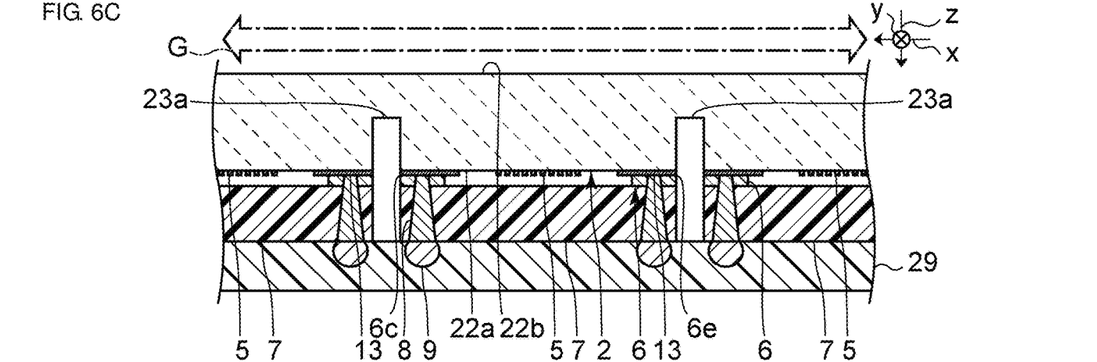
Figure 6D:
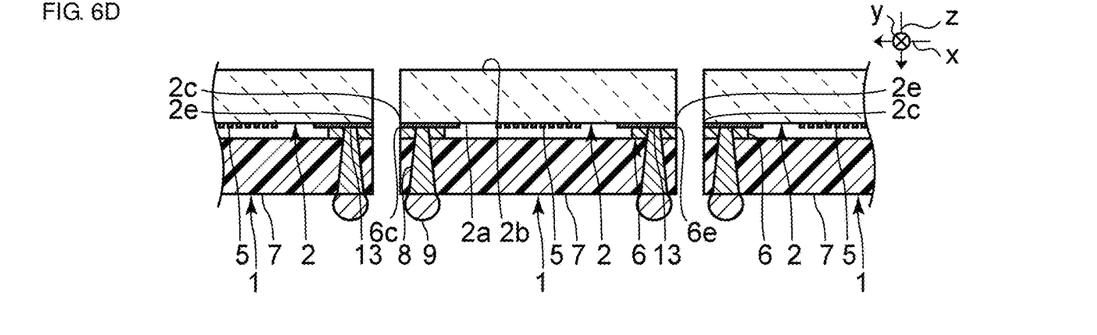

Next, as illustrated in FIG. 6C, a grind tape 29 is applied to the side of the plurality of cover members 7 for fixation. Next, the piezoelectric substrate 22 is ground on the side of the second main surface 22b. More specifically, the piezoelectric substrate 22 is ground reciprocally in a constant direction as schematically indicated by an arrow G in FIG. 6C. More specifically, the piezoelectric substrate 22 is ground reciprocally such that the angle between the first side 2c and the direction of reciprocal grinding as viewed in plan is preferably about 9.5° or less, for example. It is only necessary that the angle between the first side 6c or the second side 6d of the support member 6 and the direction of reciprocal grinding as viewed in plan should preferably be about 9.5° or less, for example. The piezoelectric substrate 22 is ground to a portion to which the piezoelectric substrate 22 has been cut halfway to divide the piezoelectric substrate 22 into individual pieces. Consequently, a plurality of acoustic wave devices 1 are obtained as illustrated in FIG. 6D. The thickness of the plurality of piezoelectric substrates 2 may be adjusted by further reciprocally grinding the plurality of piezoelectric substrates 2.

As described above, reciprocal grinding is performed in a constant direction when dividing the piezoelectric substrate 22 into individual pieces and adjusting the thickness of the piezoelectric substrate 2. Consequently, a plurality of straight or substantially straight grinding traces 12 that extend in parallel or substantially in parallel with each other are formed on the second main surface 2b of the piezoelectric substrate 2.

When the piezoelectric substrate 22 is ground to be divided into individual pieces, a stress is applied between the support member 6 and the piezoelectric substrate 22. This stress is particularly large at each of the corner portions of the support member 6. This also applies when adjusting the thickness of the piezoelectric substrate 2. Therefore, the support member 6 may be separated from the piezoelectric substrate 22 or the piezoelectric substrate 2.

In the present preferred embodiment, on the contrary, when dividing the piezoelectric substrate 22 into individual pieces, the piezoelectric substrate 22 is ground reciprocally such that the angle between the first side 6c of the support member 6 and the direction of reciprocal grinding as viewed in plan is preferably about 9.5° or less, for example. Similarly, when adjusting the thickness of the piezoelectric substrate 2, the piezoelectric substrate 2 is ground reciprocally such that the angle between the first side 6c of the support member 6 and the direction of reciprocal grinding as viewed in plan is preferably about 9.5° or less, for example. This effectively reduces or prevents a stress applied between the support member 6 and the piezoelectric substrate 2. Thus, the support member 6 is not easily separated from the piezoelectric substrate 2. The above advantageous effects will be described in detail below.

A plurality of acoustic wave devices were fabricated in a manner that was similar to the manufacturing method described above, except that the angle of reciprocal grinding was different. More specifically, a hundred acoustic wave devices were fabricated for each different angle between the first side of the support member and the direction of reciprocal grinding of the piezoelectric substrate and the piezoelectric substrate as viewed in plan. A grinding trace that led to the first corner portion of the support member as viewed in plan was formed on the second main surface of the piezoelectric substrate of each of the acoustic wave devices obtained. The angle θ between the first side of the support member and the grinding trace as viewed in plan was the above angle of reciprocal grinding in the manufacture of each of the acoustic wave devices. The incidence rate of separation of the support member from the piezoelectric substrate was examined with the plurality of acoustic wave devices. The examination results are indicated in Table 1.

TABLE 1

| Angle θ (°) | Incidence rate of separation of support member (%) |
| --- | --- |
| 0.0 | 0 |
| 5.0 | 0 |
| 7.0 | 0 |
| 8.0 | 0 |
| 8.5 | 0 |
| 9.0 | 0 |
| 9.5 | 0 |
| 10.0 | 3 |
| 10.5 | 4 |
| 11.0 | 4 |
| 11.5 | 3 |
| 12.0 | 5 |
| 12.5 | 7 |
| 15.0 | 6 |
| 30.0 | 13 |
| 45.0 | 10 |

It is seen that, as indicated in Table 1, the incidence rate of separation of the support member from the piezoelectric substrate was about 3% or more in the case where the angle θ was more than about 9.5°. It is seen, on the contrary, that the incidence rate of separation of the support member from the piezoelectric substrate was 0% in the case where the angle θ was about 9.5° or less as in the present preferred embodiment. Thus, the support member is not easily separated from the piezoelectric substrate in the present preferred embodiment.

Preferably, as illustrated in FIG. 4, a grinding trace 12B, among the plurality of grinding traces 12 of the piezoelectric substrate 2, leads to the third corner portion 6i of the support member 6 as viewed in plan, and the angle between the third side 6e and the grinding trace 12B is preferably about 9.5° or less, for example. This reduces or prevents separation of the support member 6 from the piezoelectric substrate 2 more reliably.

Figure 7:
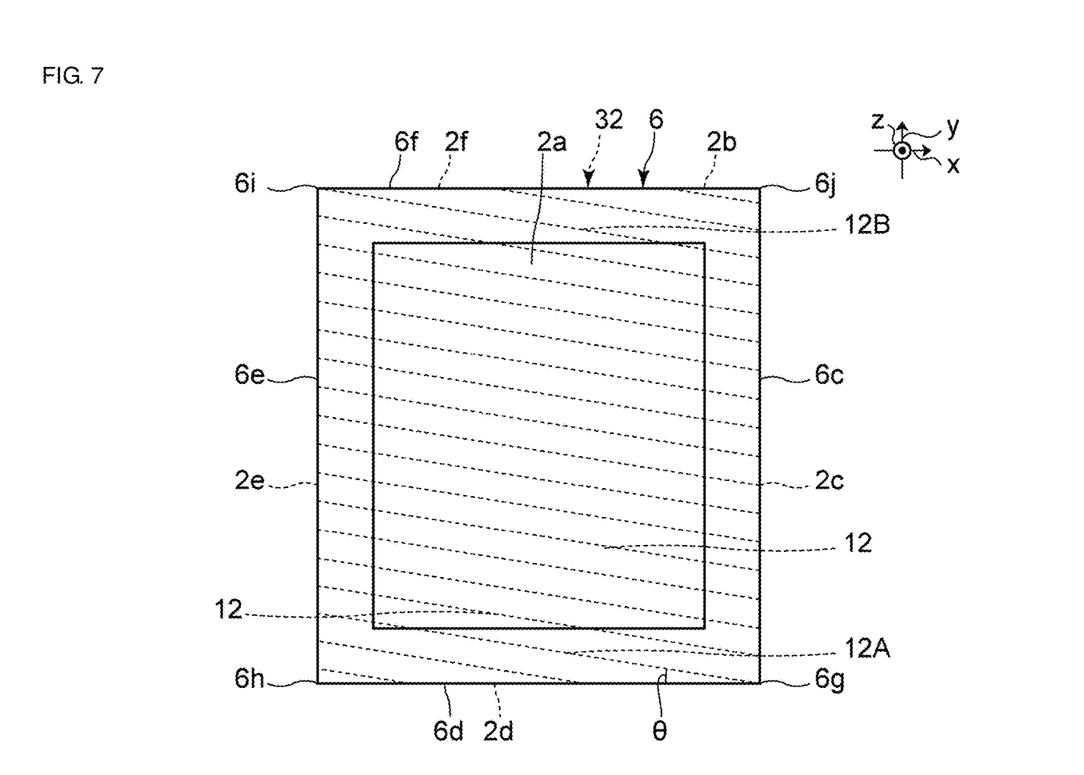
FIG. 7 is a schematic plan view of a piezoelectric substrate and a support member according to a second preferred embodiment of the present invention.

FIG. 7 is a schematic plan view of a piezoelectric substrate and a support member according to a second preferred embodiment. In FIG. 7, the under-bump metal layers 8 and the electrode structure on a piezoelectric substrate 32 are not illustrated.

In the present preferred embodiment, the direction in which the plurality of grinding traces 12 extend on the piezoelectric substrate 32 is different from that according to the first preferred embodiment. The acoustic wave device according to the second preferred embodiment is otherwise configured similarly to the acoustic wave device 1 according to the first preferred embodiment.

In the present preferred embodiment, the angle between the second side 6d of the support member 6 and the grinding trace 12A as viewed in plan is preferably about 9.5° or less, for example. This also reduces or prevents separation of the support member 6 from the piezoelectric substrate 32 as in the first preferred embodiment.

Preferably, the grinding trace 12B, among the plurality of grinding traces 12 of the piezoelectric substrate 32, leads to the third corner portion 6i of the support member 6 as viewed in plan, and the angle between the fourth side 6f and the grinding trace 12B is preferably about 9.5° or less, for example. This reduces or prevents separation of the support member 6 from the piezoelectric substrate 32 more reliably.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
    a piezoelectric substrate including a first main surface and a second main surface that oppose each other;
    an interdigital transducer electrode provided on the first main surface of the piezoelectric substrate;
    a support having a rectangular or substantially rectangular frame shape, the support including a cavity, a first side and a second side that define a portion of an outer peripheral edge of the support, and a corner portion connected to the first side and the second side, and the support being provided on the first main surface of the piezoelectric substrate such that the cavity surrounds the interdigital transducer electrode; and
    a cover provided on the support and covering the cavity of the support; wherein
    a straight or substantially straight grinding trace is provided on the second main surface of the piezoelectric substrate, the grinding trace leading to the corner portion of the support as viewed in plan;
    the first side of the support is a long side, the second side is a short side shorter than the first side; and one of an angle between the first side of the support and the grinding trace and an angle between the second side and the grinding trace as viewed in plan is about 9.5° or less.

2. The acoustic wave device according to claim 1, wherein the angle between the first side and the grinding trace as viewed in plan is about 9.5° or less.

3. The acoustic wave device according to claim 1, wherein the angle between the second side and the grinding trace as viewed in plan is about 9.5° or less.

4. The acoustic wave device according to claim 1, wherein the piezoelectric substrate includes only a piezoelectric layer.

5. The acoustic wave device according to claim 4, wherein a material of the piezoelectric layer includes lithium tantalate, lithium niobate, zinc oxide, aluminum nitride, crystal, and lead zirconate titanate.

6. The acoustic wave device according to claim 1, wherein a pair of reflectors are provided on the piezoelectric substrate on respective sides of the interdigital transducer electrode in a propagation direction of acoustic wave.

7. The acoustic wave device according to claim 1, wherein the piezoelectric substrate has a rectangular or substantially rectangular shape as viewed in plan.

8. The acoustic wave device according to claim 1, wherein
an electrode pad electrically connected to the interdigital transducer electrode is provided on the first main surface of the piezoelectric substrate; and
the support covers at least a portion of the electrode pad.

9. The acoustic wave device according to claim 1, further comprising under-bump metal layers penetrating the support and the cover.

10. The acoustic wave device according to claim 1, wherein
the piezoelectric substrate includes a first side and a second side that define a portion of an outer peripheral edge of the piezoelectric substrate, and a corner portion connected to the first side and the second side;
the first side of the support and the first side of the piezoelectric substrate overlap each other as viewed in plan;
the second side of the support and the second side of the piezoelectric substrate overlap each other as viewed in plan; and
the corner portion of the support and the corner portion of the piezoelectric substrate overlap each other as viewed in plan.

\* \* \* \* \*